United States Patent [19]

Araki et al.

[11] Patent Number: 5,374,847
[45] Date of Patent: Dec. 20, 1994

[54] NONVOLATILE SEMICONDUCTOR MEMORY DEVICE HAVING A PASSIVATION FILM

[75] Inventors: Hitoshi Araki; Hiroyuki Sasaki; Kazunori Kanebako, all of Yokohama, Japan

[73] Assignee: Kabushiki Kaisha Toshiba, Kawasaki, Japan

[21] Appl. No.: 838,114

[22] Filed: Feb. 20, 1992

[30] Foreign Application Priority Data

Feb. 21, 1991 [JP] Japan .................. 3-077381
Jan. 27, 1992 [JP] Japan .................. 4-012398

[51] Int. Cl.$^5$ .................. H01L 21/316; H01L 21/318
[52] U.S. Cl. ..................... 257/639; 257/649; 257/323
[58] Field of Search ............... 257/639, 649, 323, 321, 257/433

[56] References Cited

U.S. PATENT DOCUMENTS

| | | | |
|---|---|---|---|
| 4,532,022 | 7/1985 | Takasaki et al. | 257/323 |
| 4,618,541 | 10/1986 | Forouhi et al. | 257/640 |
| 4,621,277 | 11/1986 | Ito et al. | 257/639 |
| 4,665,426 | 5/1987 | Allen et al. | 357/54 |
| 4,717,631 | 1/1988 | Kaganowicz et al. | 257/634 |
| 4,830,974 | 5/1989 | Chang et al. | 257/316 |
| 5,065,222 | 11/1991 | Ishii | 257/639 |

FOREIGN PATENT DOCUMENTS 0185787 8/1988 European Pat. Off. .
0281324 9/1988 European Pat. Off. .
0307099 3/1989 European Pat. Off. .

OTHER PUBLICATIONS

J. Miyamoto et al., *Process Technologies for a 16 ns High Speed 1MB CMOS EPROM,* 1990 Autumn Nat'l Conf. of the Institute of Electronics, Information and Communication Engineers, Oct. 1–4, 1990.

T. Fujiwara et al., *Evaluation of Plasma Deposited Silicon Dioxide–Barrier Effect Against Water,* Sep. 26–29, 1990.

*Primary Examiner*—Robert Limanek

[57] ABSTRACT

A memory cell is formed in the main surface area of a semiconductor substrate. An inter-level insulation film is formed on the substrate to cover the memory cell. An opening is formed in the inter-level insulation film to reach the memory cell. An internal wiring layer is electrically connected to the memory cell via the opening. A protection film is formed on the inter-level insulation film to cover the internal wiring layer. The protection film is formed of a material containing at least silicon and oxygen and the refractive index thereof is set within a range of 1.48 to 1.65.

16 Claims, 21 Drawing Sheets

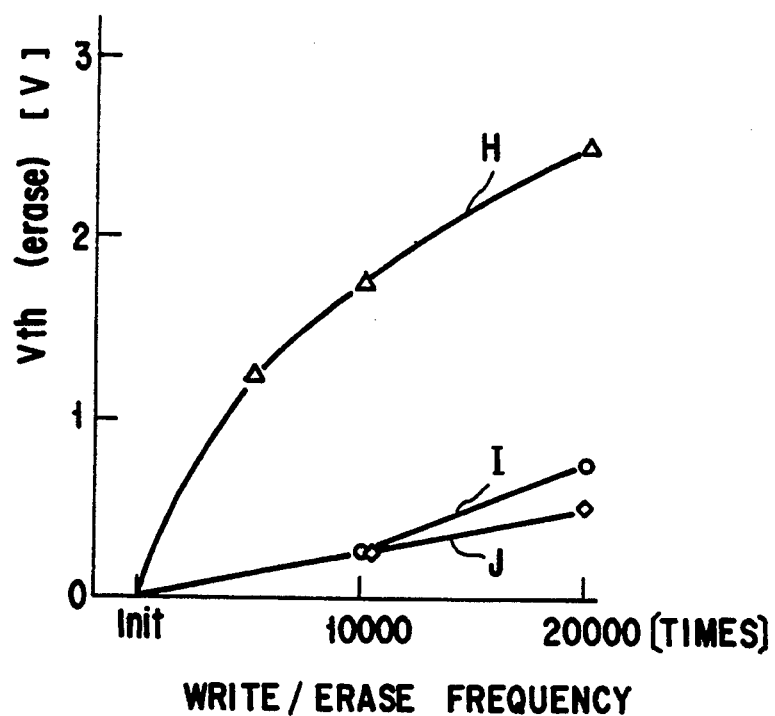
F I G. 6
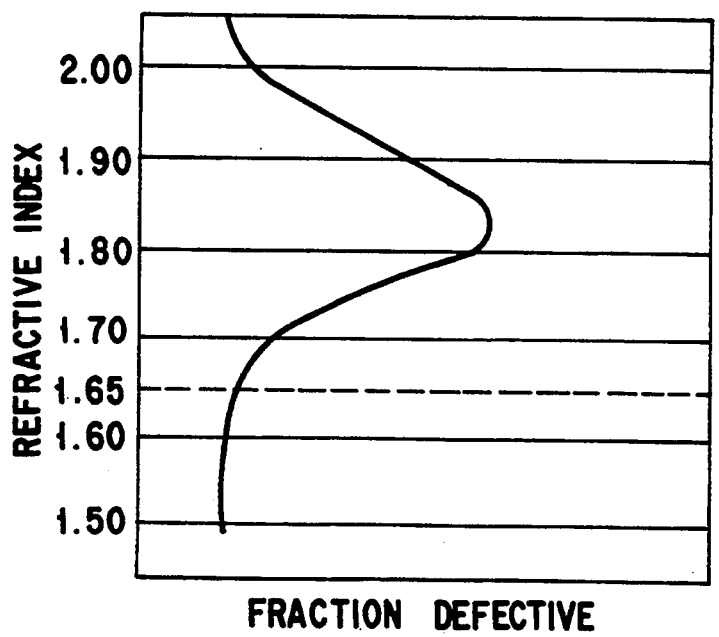
F I G. 7

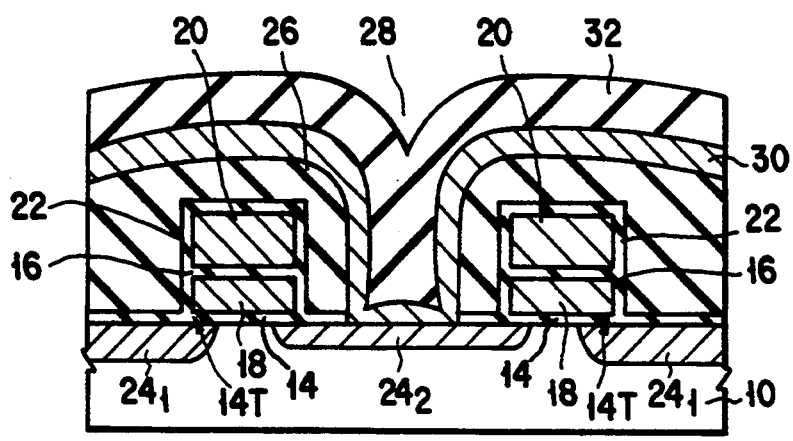
F I G. 12

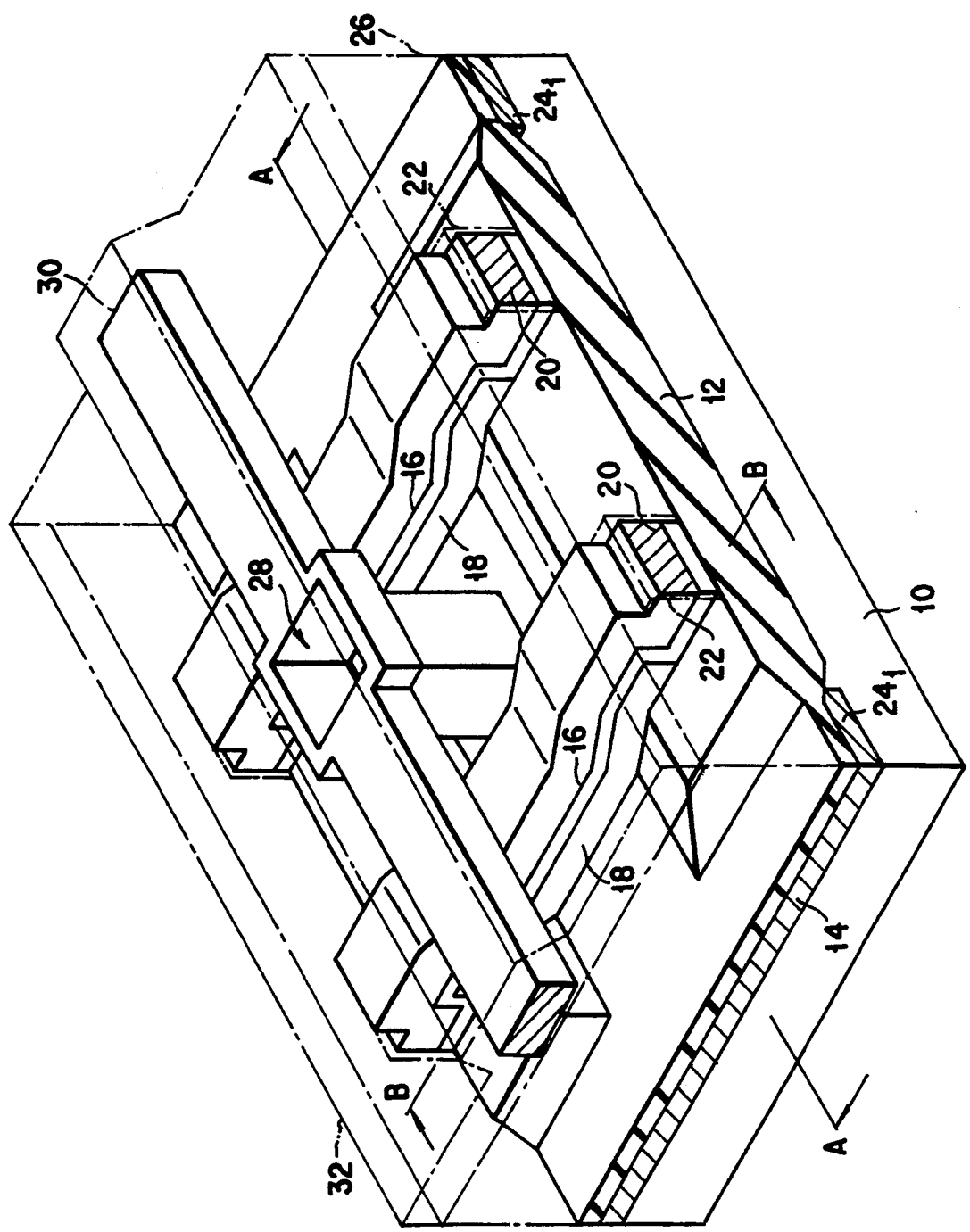
F I G. 13

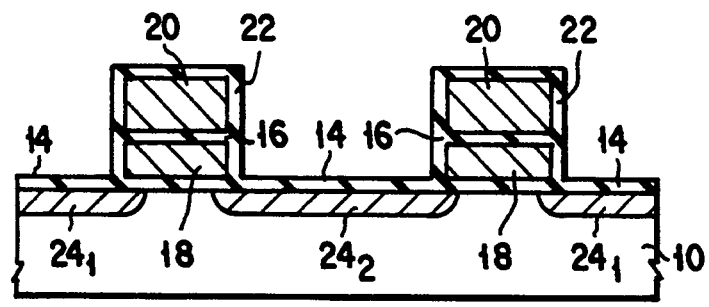
F I G. 14 A
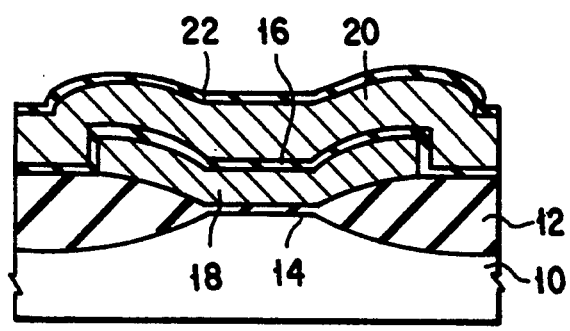
F I G. 15 A

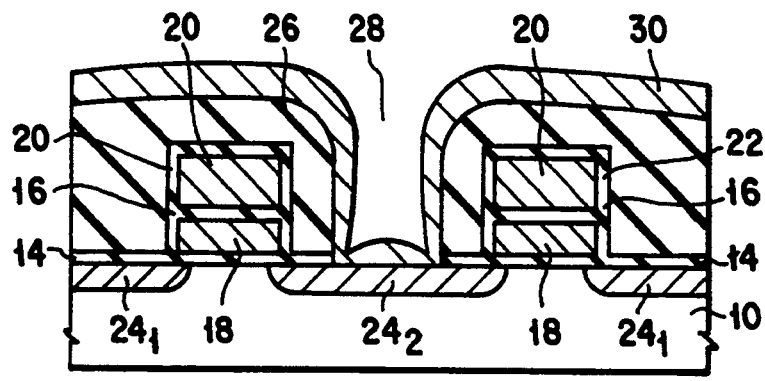
F I G. 14 C
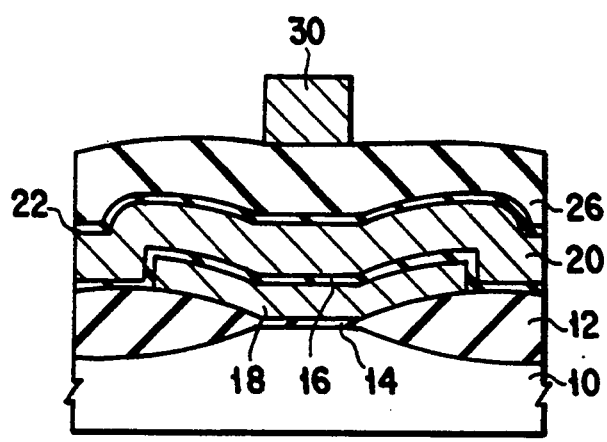
F I G. 15 C

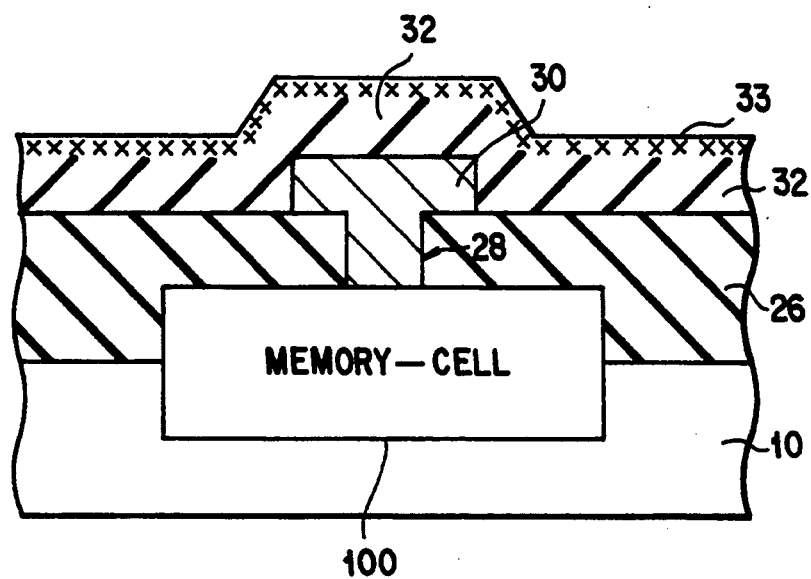
F I G. 16

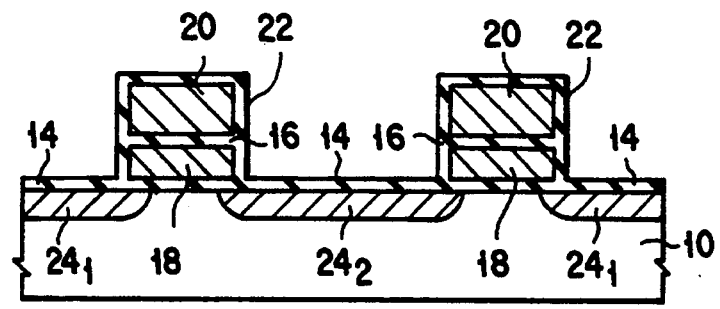
F I G. 18A
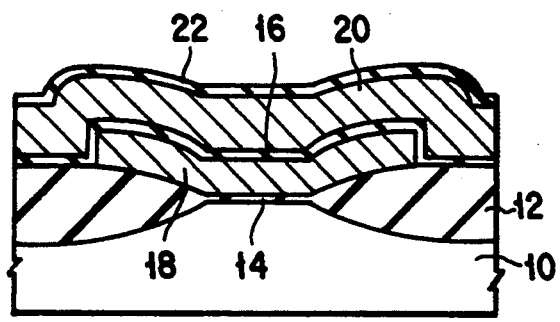
F I G. 19A

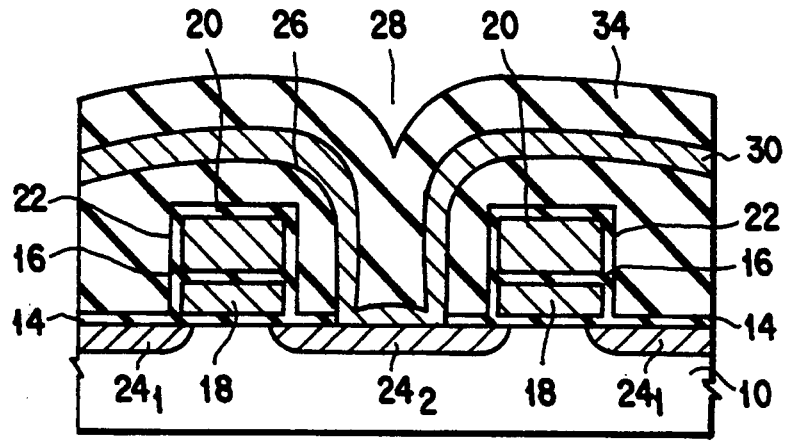
F I G. 18D
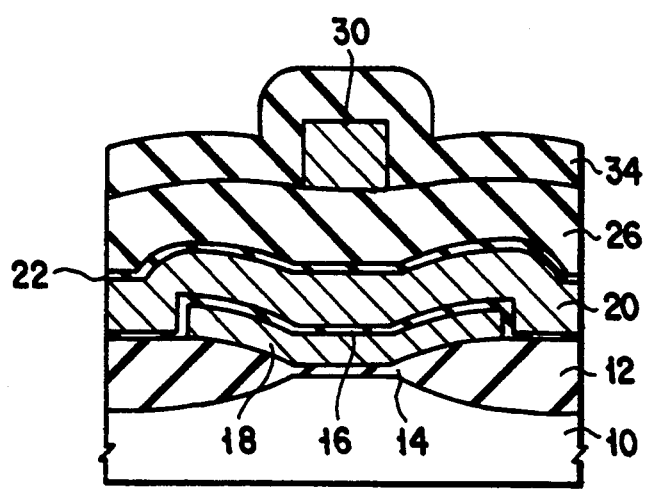
F I G. 19D

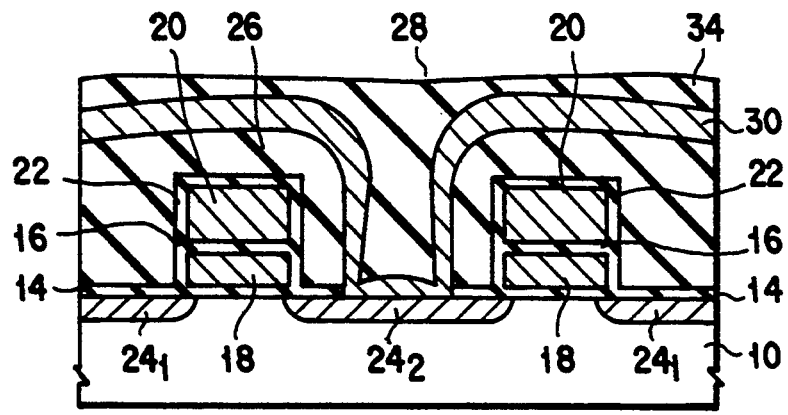
F I G. 18E
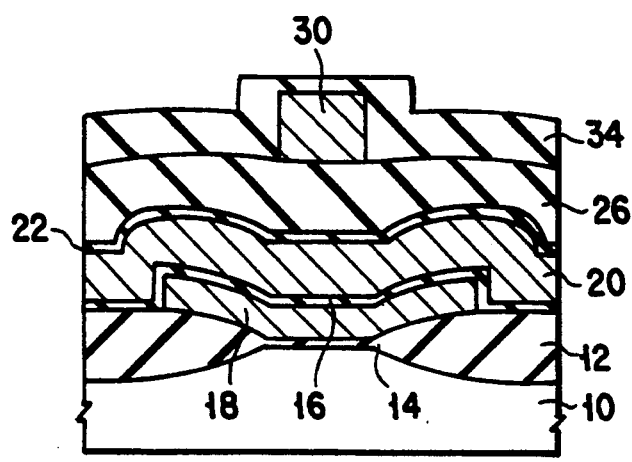
F I G. 19E

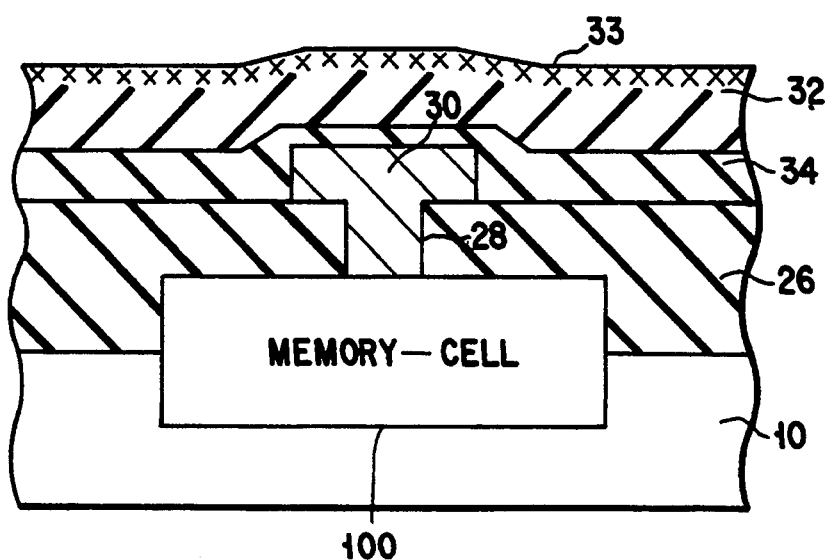
F I G. 20

NONVOLATILE SEMICONDUCTOR MEMORY DEVICE HAVING A PASSIVATION FILM

BACKGROUND OF THE INVENTION

1. Field of the Invention

This invention relates to a nonvolatile semiconductor memory device and more particularly to a nonvolatile semiconductor memory device having an improved passivation film.

2. Description of the Related Art

Deterioration of the data retention characteristic of a memory cell is a serious problem when the reliability of a nonvolatile semiconductor memory device is considered.

In EPROMs or flash EEPROMs, the state in which charges (electrons) are injected into the charge storage section is called a "programmed" state and data is stored in this state, and in contrast, the state in which charges (electrons) are not injected into the charge storage section is called an "erased" state and data is cleared in this state. If the electrons are moved from the charge storing section, the stored data is lost. Therefore, the data retention characteristic is an important factor in the nonvolatile semiconductor memory device since it is required to hold the data over a long period of time.

Deteriorization of the data retention characteristic is largely dependent on the following two factors.

The first factor is the film quality of an oxide film formed to cover the charge storing section, that is, the floating gate. If the film quality of the oxide film is low, the data retention characteristic is deteriorated. This is because the charges stored in the floating gate are discharged out of the floating gate via that portion of the oxide film which is low in film quality by the effect of the self electric field of the floating gate. As a result, the threshold value of the cell transistor is lowered and the stored data is lost.

The second factor is the presence of mobile ions such as $Na^+$, $K^+$ and $Li^+$. The mobile ions are attracted towards the floating gate by the effect of the self electric field of the floating gate and neutralize the stored charges. This also causes the threshold value of the memory cell to be lowered.

When a BPSG film or PSG film is used as an interlevel insulation film, mobile ions in the semiconductor memory device can be gettered or captured by the film so that deterioration of the data retention characteristic can be prevented. Mobile ions entering from the exterior of the semiconductor memory device can be prevented from further moving towards the floating gate by means of a PSG film used as the passivation film.

However, as the size of the semiconductor memory device is further reduced and the integration density thereof is further increased, the semiconductor device manufacturing process must be effected at low temperatures, and as a result, the reliability of the oxide film is lowered.

Further, as the size and thickness of the element are further reduced, the film thickness of the BPSG film or PSG film is reduced and the wiring interval is reduced so that the film thickness of the PSG passivation film formed on the side wall of the wiring layer will be reduced and the gettering effect by the passivation film will become small. Thus deterioration of the data retention characteristic will develop into a serious problem as size of the semiconductor memory device is further reduced and as the integration density thereof is further increased.

SUMMARY OF THE INVENTION

The object of this invention is to provide a nonvolatile semiconductor memory device which remains reliable even if its data retention characteristic is deteriorated.

In order to achieve the above object, in this invention, there is provided a passivation film formed of material which contains at least silicon and oxygen and whose refractive index is set to be not less than 1.48 and not more than 1.65.

We found that a preferable data retention characteristic could be attained when the passivation film formed of material containing at least silicon and oxygen was used and the refractive index of the material was set to be equal to or larger than 1.48.

In order to detect an optimum value of the refractive index of the material used for the semiconductor device, tests for observing the destruction of internal wiring layers were made by use of the above material having the refractive index of not less than 1.48. As the result of the tests, it was found that if the refractive index exceeded 1.6 when the minimum width of the wiring layer was 1.2 $\mu$m, the number of internal wiring layers started to increase, and particularly, the destruction of the internal wiring layer became significant when the refractive index was set to be larger than 1.65 to 1.70.

Therefore, the data retention characteristic of the nonvolatile semiconductor memory device can be improved and the possibility that the internal wiring layer is destroyed can be suppressed by using a passivation film formed of material which contains at least silicon and oxygen and whose refractive index is set to be not less than 1.48 and not more than 1.65.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 6 is a diagram illustrating, in detail, how the threshold voltage $V_{th}$ (erase) (FIG. 5) changes;

FIG. 7 is a diagram showing the relation between the refractive index of a silicon oxide film and the fraction defective of a wiring layer (whose minimum wiring width is 1.2 μm) formed under the silicon oxide film;

FIG. 12 is a cross sectional view of a batch-erasing EEPROM cell;

FIG. 13 is a perspective view of the EPROM memory cell shown in FIG. 11;

FIGS.14A, 14B, 14C and 14D are cross sectional views showing cross sections of a memory cell corresponding to the cross section taken along the A—A line of FIG. 13 in an order of the manufacturing steps;

FIGS. 15A, 15B, 15B 15C and 15D are cross sectional views showing cross sections of a memory cell corresponding to the cross section taken along the B—B line of FIG. 13 in an order of the manufacturing steps;

FIG. 16 is a cross sectional view showing a modification of the semiconductor device having the passivation film according to the first embodiment of this invention;

FIGS. 18A, 18B, 18C, 18D, 18E and 18F are cross sectional views showing cross sections of a memory cell corresponding to the cross section taken along the A—A line of FIG. 13 in an order of the manufacturing steps;

FIGS. 19A, 19B, 19C, 19D, 19E and 19F are cross sectional views showing cross sections of a memory cell corresponding to the cross section taken along the B—B line of FIG. 13 in an order of the manufacturing steps; and FIG. 20 is a cross sectional view showing a modification of the semiconductor device having the passivation film according to the second embodiment of this invention.

DETAILED DESCRIPTION OF THE PREFERRED EMBODIMENTS

Figure 1:
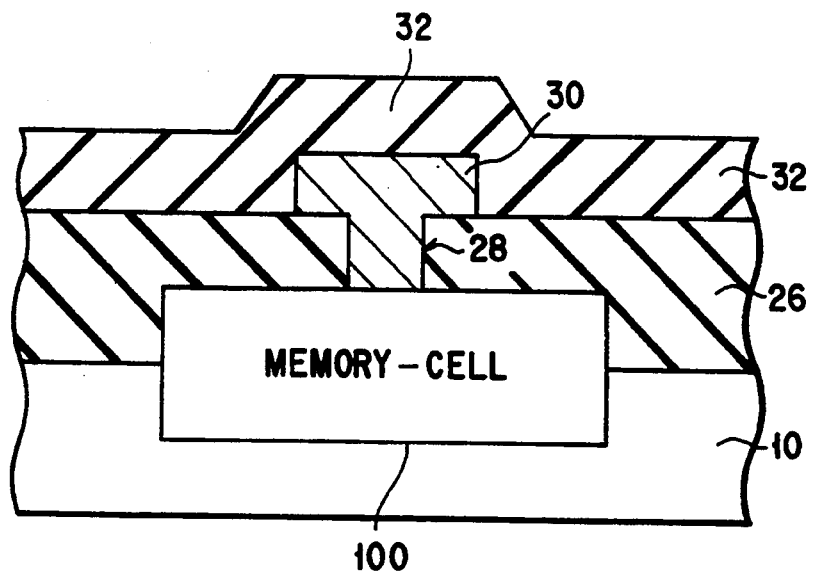
FIG. 1 is a schematic cross sectional view showing a semiconductor device having a passivation film according to a first embodiment of this invention.

There will now be described a semiconductor device having a passivation film according to one embodiment of this invention and a method for manufacturing the same. In this explanation, the same reference numerals are used to denote substantially the same portions throughout the accompanying drawings and the explanation for the same portions is omitted.

FIG. 1 is a schematic cross sectional view showing a semiconductor device having a passivation film according to a first embodiment of this invention.

As shown in FIG. 1, a memory cell 100 is formed in the main surface area of a silicon substrate 10. For example, a BPSG film 26 is formed as an inter-level insulation film on the silicon substrate 10 to cover the memory cell 100. An opening 28 is formed in the BPSG film 26 to reach the memory cell 100. An internal wiring layer, for example, bit line 30 is formed on the BPSG film 26 to be electrically connected to the memory cell 100 via the opening 28. Further, a silicon oxide film 32 whose refractive index is set to be not less than 1.48 and not more than 1.65 is formed as a passivation film on the BPSG film 26 so as to cover the bit line 30.

In this example, the silicon oxide film 32 is formed to cover the bit line 30, and since the silicon oxide film 32 is a passivation film, it is formed on a wiring layer which is formed on the top portion as viewed from the main surface of the substrate 10.

Next, the relation between the type of material of the passivation film and the data retention characteristic of the nonvolatile semiconductor memory device is explained.

Figure 2:
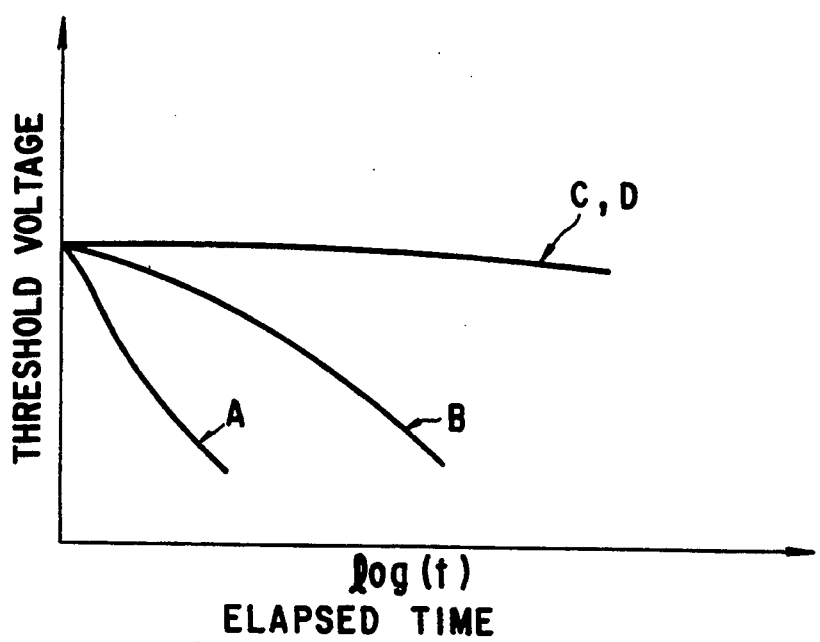
FIG. 2 is diagram showing the result of the data retention characteristic test of devices having various passivation films.

FIG. 2 is a diagram showing the result of the data retention characteristic tests of devices having various passivation films. In FIG. 2, the ordinate indicates the threshold voltage of the memory cell and the abscissa indicates the elapsed testing time. The tests were carried out by leaving samples in a high temperature atmosphere and observing the relation between elapsed time and variation in the threshold voltage so as to check variation in the data retention characteristic with time. The tests were carried out under a condition that ultraviolet erasable EPROMs were used as the samples and the samples were left in an atmosphere of 250° C.

The samples (A) to (D) shown in FIG. 2 employ the following passivation films:
(A) a PSG film;
(B) a silicon oxide film having the refractive index of less than 1.47;
(C) a silicon oxide film having the refractive index of not less than 1.48 and not more than 1.70;
(D) a silicon oxide film having the refractive index of not less than 1.70.

As shown in FIG. 2, reduction in the threshold voltage of the EPROM (A) is most significant. The threshold voltage of the EPROM (B) is also significantly lowered. In contrast, the threshold voltages of the EPROMs (C) and (D) are not significantly lowered and exhibit preferable data retention characteristics.

Next, the relation between the refractive index of the silicon oxide film and the data retention characteristic of the nonvolatile semiconductor memory device is explained.

Figure 3:
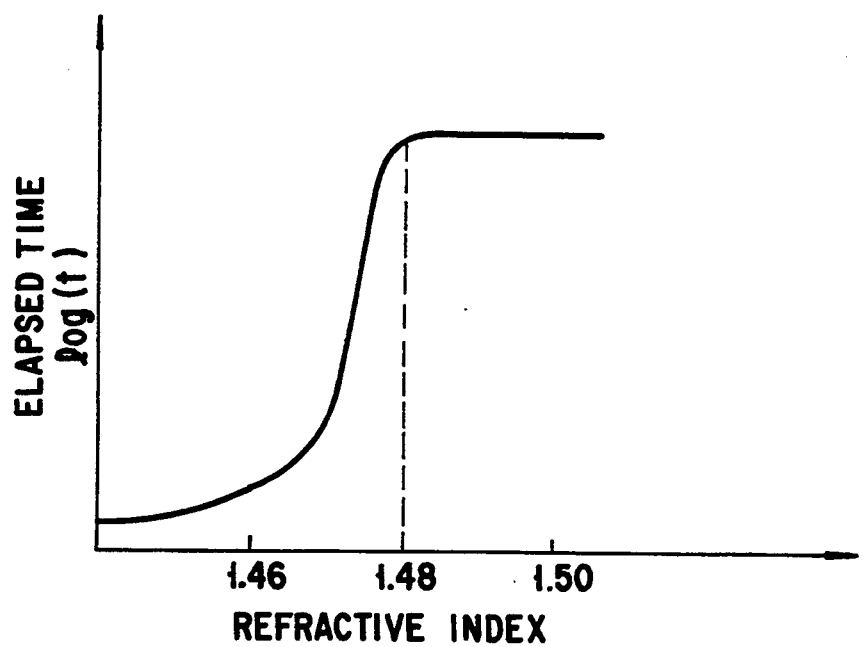
FIG 3 is a diagram showing the result of the data retention characteristic tests of devices when the refractive index of a silicon oxide film is changed.

FIG. 3 is a diagram showing the result of the data retention characteristic tests when the refractive index of the silicon oxide film is changed. In FIG. 3, the ordinate indicates time required for the threshold voltage of a cell to be lowered to 40% after the threshold voltage of the cell at the programming or writing time is set to a value corresponding to 100% and the abscissa indicates the refractive index of the silicon oxide film.

The tests were carried out under a condition that ultraviolet erasable EPROMs were used as the samples and the samples were left in an atmosphere of 250° C.

As is clearly understood from FIG. 3, time required for the threshold voltage to be lowered to 40% becomes longer when the refractive index exceeds 1.46. The time tends to be kept unchanged when the refractive index becomes equal to or larger than approx. 1.48.

From the above test result, it may be considered that when the refractive index of the silicon oxide film is less than 1.48, the impurity resistance and moisture proofness thereof are bad and mobile ions such as Na may easily enter the device via the passivation film to neutralize the charges in the floating gate.

AS described above, it is made clear that variation in the threshold voltage of an EPROM having an silicon oxide film whose refractive index is not less than 1.48 as the passivation film is small. Therefore, if the passivation film formed of a silicon oxide film having the refractive index of not less than 1.48 is used, a memory cell can be formed to have a good data retention characteristic.

Figure 4:
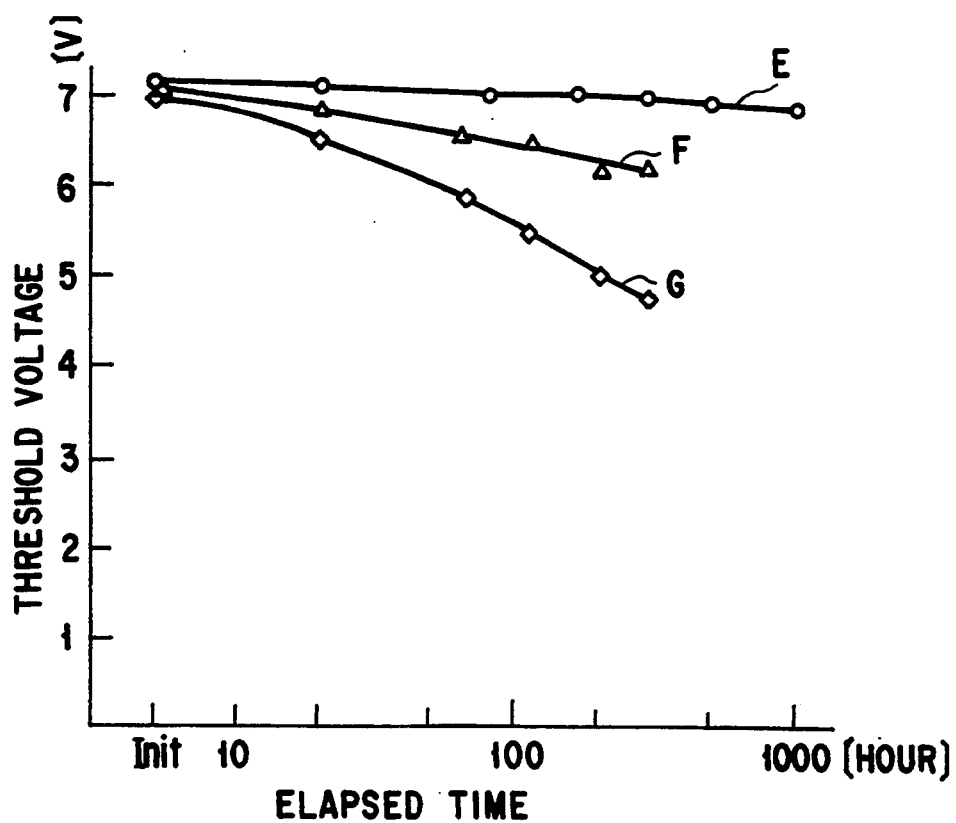
FIG. 4 is a diagram showing the result of the data retention characteristic tests which are similar to the tests explained with reference to FIG. 2.

FIG. 4 is a diagram showing the result of the data retention characteristic tests which are similar to the tests explained with reference to FIG. 2. The samples are flash EEPROMs. As each of the threshold voltages shown in FIG. 4, the lowest one of the corresponding threshold voltages of a plurality of memory cells of the EEPROM is plotted.

The samples (E) to (G) shown in FIG. 4 employ the following passivation films:
 (E) uses a silicon oxide film having the refractive index of 1.50;
 (F) uses an SiNx film; and
 (G) uses a PSG film.

As shown in FIG. 4, the amount of reduction in the threshold voltage of the EEPROM (E) with time is smallest and a good data retention characteristic can be obtained. It is also proved from the above tests that the EEPROM (E) has a better data retention characteristic than the EEPROM (F) having a silicon nitride (SiNx) film as the passivation film. This means that the silicon oxide film having the refractive index of 1.52 is excellent in the effect of protecting the device in comparison with the SiNx film which is now most widely used as the passivation film.

The relation between the various types of passivation films and the endurance characteristic of the nonvolatile semiconductor memory device was also observed.

Figure 5:
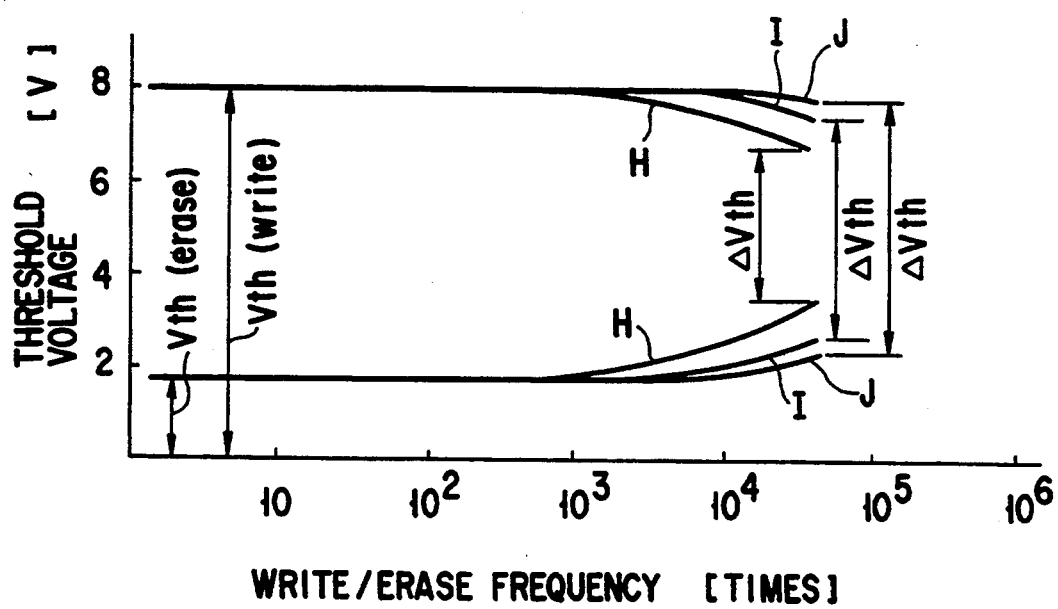
FIG. 5 is a diagram showing the result of write/erase repetition tests.

FIG. 5 shows the result of write/erase repetition tests. In FIG. 5, the abscissa indicates the frequency of repeating write/erase operations, and the ordinate indicates the threshold voltage ($V_{th}$) of a memory cell. The samples put to the test are flash EEPROMs.

The samples (H) to (J) shown in FIG. 5 employ the following passivation films:
 (H) uses an SiNx film;
 (I) uses a silicon oxide film having the refractive index of 1.50; and
 (J) uses a PSG film.

As is evident from FIG. 5, the more times the write/read operation was repeated, the more greatly the threshold voltage decreased, and the better the endurance characteristic became.

As can be understood from FIG. 5, too, the reduction (generally known as "window narrowing") in the threshold voltages of the EEPROMs (I) and (J) were small, and these EEPROMs have good endurance characteristics. The threshold reduction $\Delta V_{th}$ is: $V_{th}(\text{write}) - V_{th}(\text{erase})$; where $V_{th}(\text{write})$ is the threshold voltage at which data is written into the cell and $V_{th}(\text{erase})$ is the threshold voltage at which data is read from the cell. As the result of the above tests, it is found that the amount of reduction in the threshold voltage of the EEPROM (H) using the silicon nitride film as the passivation film caused by an increase in the repetition frequency is large. The reason for this may be considered that since ammonia ($NH_3$) is used when the SiNx film is formed, a large amount of hydrogen (20 to 25 at %) may be absorbed or introduced into the film. That is, since the passivation film contains a large amount of hydrogen, the hydrogen tends to be diffused into the internal portion of the device. As is well known in the art, hydrogen is one of the factors which may change the threshold voltage of a transistor. In an EEPROM, electrons pass through the gate insulating film or the tunnel insulating film every time the write/erase operation is carried out. Hence, window narrowing is more prominent in the EEPROM (H) than in the EEPROM (I), since more traps exist in the gate insulating film and tunnel insulating film of the EEPROM (J) than in those of the EEPROM (I). The content of hydrogen in the silicon oxide film ($SiO_2$) is not more than 10 at %.

FIG. 6 illustrates, in detail, how the threshold voltage $V_{th}$ (erase) (FIG. 5) changes. In FIG. 5, the abscissa indicates the number of times the write/erase operation was repeated, and the ordinate represents the change in the threshold voltage of the memory cell. The change of the threshold voltage is defined as: $V_{th}(\text{write}) - V_{th}(\text{erase})\text{Init}$.

Next, the relation between the refractive index of the silicon oxide film and the fraction defective of the wiring layer is explained.

As was explained above, the data retention characteristic of a memory cell could be improved by use of a passivation film formed of a silicon oxide film having the refractive index of not less than 1.48. Further, the relation between the refractive index of the silicon film and the fraction defective of the wiring layer formed under the oxide film was observed on the assumption that the passivation film formed of a silicon oxide film having the refractive index of not less than 1.48 could be practically used.

FIG. 7 is a diagram showing the relation between the refractive index of a silicon oxide film and the fraction defective of a wiring layer (whose minimum wiring width is 1.2 $\mu$m) formed under the silicon oxide film. In FIG. 7, the ordinate indicates the refractive index of the silicon oxide film and the abscissa indicates the fraction defective of the wiring layer.

As is understood from FIG. 7, the fraction defective of the wiring layer whose minimum wiring width is 1.2 $\mu$m has a tendency to increase when the refractive index becomes equal to or larger than 1.60, reaching its maximum when the refractive index takes a value which is substantially equal to approx. 1.80, and then decreasing after the refractive index becomes larger than the above value. Judging from this tendency, it may be considered that there exists a close relation between the refractive index of the silicon oxide film and the fraction defective of the wiring layer. For example, it may be inferred from the relation shown in FIG. 7 that the silicon oxide film having the refractive index of 1.70 to 2.00 gives a large stress to the wiring layer and the stress causes the stress migration in the wiring layer.

Therefore, in order to reduce the fraction defective of the wiring layer when the minimum wiring width of the wiring layer is not more than 1.2 $\mu$m, it is preferable to set the refractive index of the silicon oxide film used as the passivation film within the range of 1.48 to 1.60.

In a case where the minimum wiring width of the wiring layer is not less than 1.2 $\mu$m, the fraction defective rapidly increases when the refractive index becomes equal to or larger than 1.70 as shown in FIG. 7, and therefore, it is preferable to set the refractive index within the range of 1.48 to 1.65 by taking some margins into consideration when the silicon film is used as the passivation film of the semiconductor device.

Next, the relation between the refractive index of the silicon oxide film and the transmittance of ultraviolet rays.

Figure 8:
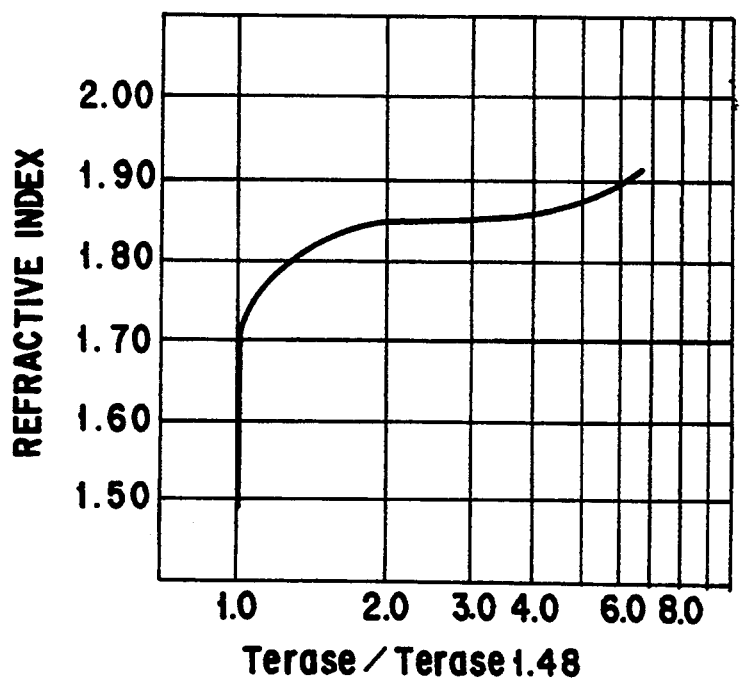
FIG. 8 is a diagram showing the relation between the refractive index of a silicon oxide film and the data erasing time of an ultraviolet erasable EPROM.

FIG. 8 is a diagram showing the relation between the refractive index of a silicon oxide film and the data erasing time of an ultraviolet erasable EPROM. In FIG. 8, the ordinate indicates the refractive index of the silicon oxide film and the abscissa indicates the ratio of the data erasing time ($T_{erase}$) of EPROMs having silicon oxide films with various refractive indices to the data erasing time ($T_{erase1.48}$) set as the reference time of an EPROM having a silicon oxide film with the refractive index of 1.48 used as passivation film. The wavelength $\lambda$ of the ultraviolet ray is approximately 250 nm.

As shown in FIG. 8, the data erasing time of the EPROMs having silicon oxide films with the refractive indices not more than 1.70 as the passivation film is substantially the same as that of the EPROM having the silicon oxide film with the refractive index of 1.48 as the passivation film. However, when the refractive index becomes larger than 1.70, the data erasing time increases and the data erasing characteristic is degraded. For example, the data erasing time of the EPROM having the silicon oxide film with the refractive index of 1.90 as the passivation film is approximately six times that of the EPROM having the silicon oxide film with the refractive index of 1.48 as the passivation film.

Therefore, if the refractive index of the silicon oxide film is not more than 1.70, a preferable transmittance of the ultraviolet ray can be attained.

Next, the relation between the types of passivation films and the data erasing time of the nonvolatile semiconductor memory device is explained.

Figure 9:
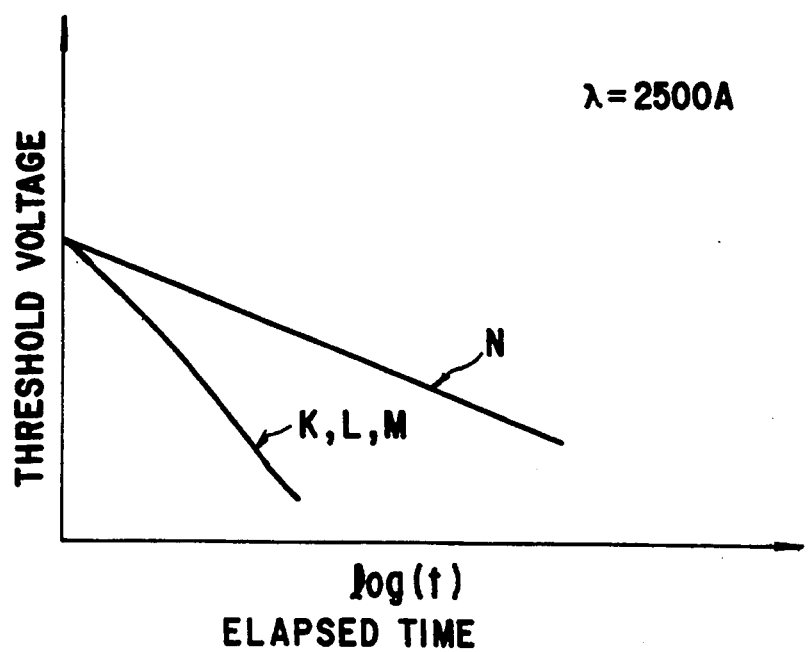
FIG. 9 is a diagram showing the result of data erasing characteristic tests of ultraviolet erasable EPROMs having various types of passivation films.

FIG. 9 is a diagram showing the result of data erasing characteristic tests of ultraviolet erasable EPROMs having various types of passivation films. In FIG. 9, the ordinate indicates the threshold voltage of a memory cell and the abscissa indicates the elapsed time.

The samples (K) to (N) shown in FIG. 9 employ the following passivation films:

(K) a PSG film;
(L) a silicon oxide film having the refractive index of less than 1.47;
(M) a silicon oxide film having the refractive index of not less than 1.48 and not more than 1.70;
(N) a silicon oxide film having the refractive index of not less than 1.70.

As shown in FIG. 9, the EPROM (M) has substantially the same data erasing characteristic as the EPROM (K). Therefore, the data erasing characteristic is good when the silicon oxide films having refractive indices of 1.48 to 1.70 are used.

There are some EPROMs having silicon nitride films having refractive index of approx. 1.9 as the passivation film (reference document: U.S. Pat. No. 4,665,426). There is no concrete information on this type of devices, but it may be safe to say that this type of device will not have a better data erasing characteristic than the EPROM (M) since the transmittance of the silicon nitride film having the refractive index of approximately 1.9 for the ultraviolet rays is approximately 60%.

Next, an example of a semiconductor device to which this invention can be preferably applied is explained.

In this invention, since the data retention characteristic can be improved, it is preferable to apply this invention to a nonvolatile semiconductor memory device having a charge storing section such as a floating gate.

As examples of the nonvolatile semiconductor memory device, a one-time programmable ROM (OTPROM) into which data can be programmed only once, an erasable programmable ROM (EPROM) in which data can be programmed and stored data can be erased by application of ultraviolet rays UV, an electrically erasable programmable ROM (EEPROM) in which data can be programmed and stored data can be electrically erased and the like are provided.

Figure 10:
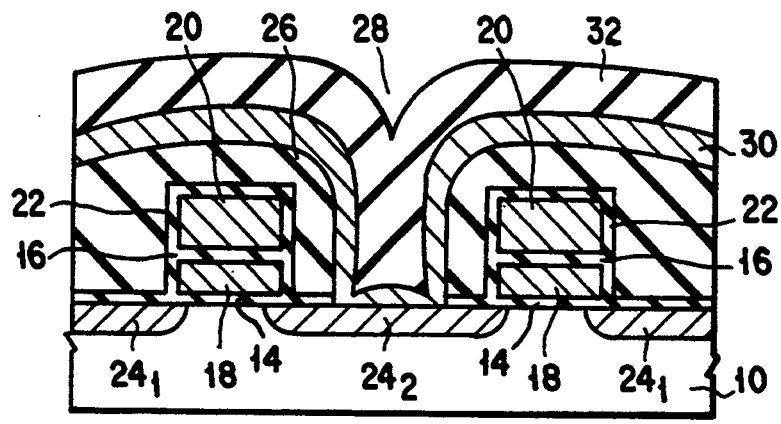
FIG. 10 is a cross sectional view of an OTPROM cell.

FIG. 10 is a cross sectional view of an OTPROM cell.

AS shown in FIG. 10, N-type source regions $24_1$ and N-type drain region $24_2$ are formed in the main surface area of a P-type silicon substrate 10. A first gate oxide film 14 is formed on the main surface area of the P-type silicon substrate 10 and floating gates 18 are formed on the first gate oxide film 14. Second gate oxide films 16 are respectively formed on the floating gates 18 and control gates 20 are respectively formed on the second gate oxide films 16. Thus, the above regions and layers constitute an OTPROM cell 102.

Figure 11:
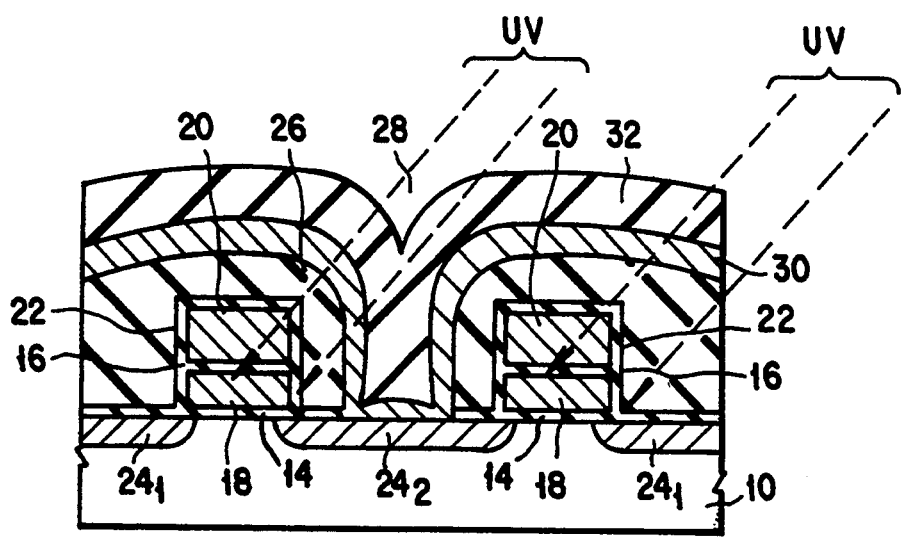
FIG. 11 is a cross sectional view of an ultraviolet erasable EPROM cell.

FIG. 11 is a cross sectional view of an ultraviolet erasable EPROM cell.

As shown in FIG. 11, an EPROM cell 104 has the same construction as the OTPROM cell 102 of FIG. 10. The difference therebetween is that ultraviolet rays UV can be applied to the floating gate 18 in the EPROM. Therefore, in the EPROM, a transmission window (not shown) for ultraviolet rays is formed in that portion of a package (not shown) which lies above the cell 104.

FIG. 12 is a cross sectional view of a batch-erasing type EEPROM cell, or an ETOX (EPROM Tunnel Oxide) type cell.

As shown in FIG. 12, an EEPROM 106 has a construction similar to that of the OTPROM of FIG. 10. The difference therebetween is that the source region $24_1$ and the floating gate 18 are formed to partly overlap with each other with a tunnel oxide film 14T disposed therebetween. This construction is made in order to permit data to be electrically erased by use of a tunnel current (Fowler-Nordheim current: F-N current) flowing in the thin oxide film or tunnel oxide film 14T.

For example, EEPROM cell 106 of ETOX type, which is shown in FIG. 12, the stored data is erased in the following manner.

The control gate 20 and drain region $24_2$ are set to a "low potential" and the source region $24_1$ is set to a "high potential" to apply an "intense electric field" to the tunnel oxide film 14T. This causes an F-N current to flow in the tunnel oxide film 14T so that electrons stored in the floating gate 18 may be extracted and discharged ! into the source region $24_1$.

The present invention is not limited to the cells shown in FIGS. 10 to 12. It can be applied to a nonvolatile semiconductor memory device which has charge-holding portions such as floating gates 18. The passivation film 32 according to the invention can be used in the memory device, thereby to enhance the data retention characteristic of the memory device. Nonvolatile semiconductor memories of this type are disclosed in: Guatam Verma et al., *Reliability Performance of ETOX Based Flash Memories*, Proc. IRPS 158 (1988); Masaki Momodomi et al., *A 4-Mb NAND EEPROM with Tight Programmed Vt Distribution*, 26 IEEE J. Solid-State Physics, April, 1991, at 492; and Dumitru Cioaca et al., *A Million-Cycle CMOS256K EEPROM*, SC-22 IEEE J. Solid-State Circuits, October 1987, at 684.

Next, the method of manufacturing a nonvolatile semiconductor memory device having a passivation film according to this invention is explained.

FIG. 13 is a perspective view of the EPROM memory cell shown in FIG. 11. FIGS. 14A to 14D are cross sectional views showing cross sections of the memory cell corresponding to the cross section taken along the A—A line of FIG. 13 in an order of the manufacturing steps. FIGS. 15A to 15D are cross sectional views showing cross sections of the memory cell corresponding to the cross section taken along the B—B line of FIG. 13 in an order of the manufacturing steps.

As shown in FIGS. 14A and 15A, an element isolation region 12 formed of a silicon oxide film with a film thickness of 500 nm, for example, is formed by selectively oxidizing the surface of a P-type single crystal silicon substrate 10, for example. Then, a silicon oxide film 14 with a film thickness of 20 nm, for example, is formed by thermally oxidizing the surface of the silicon substrate 10 except the portion of the isolation region 12, for example. Next, a first-level polysilicon layer is deposited to a thickness of 200 nm on the entire surface of the silicon substrate 10 by the CVD method. After this, a resist pattern is formed by the photolithographic technique and a portion of the first-level polysilicon layer is selectively etched on the isolation region 12 by the RIE method with the resist pattern used as a mask. In this etching process, an opening used for isolating the floating gate of the memory cell from floating gates of the other memory cells in the later step (in the floating gate isolation region forming step) is formed. Then, the surface of the first-level polysilicon layer is thermally oxidized, for example, to form a silicon oxide film 16 with a film thickness of 30 nm. Next, a second-level polysilicon layer is deposited on the entire surface of the silicon substrate 10 by the CVD method, for example, and a silicide layer is formed on the second-level polysilicon layer to constitute a laminated film of the silicide layer and polysilicon layer having a film thickness of 500 nm, for example. After this, a resist pattern is formed by the photolithographic technique and the laminated film is etched with the resist pattern used as a mask and the silicon oxide film 16 and the first-level polysilicon layer are also selectively etched. In this etching process, a floating gate 18 formed of the first-level polysilicon layer and a control gate (word line) 20 formed of the laminated film are formed. Then, N-type impurity such as As or P is ion-implanted into the silicon substrate 10 to form a source region $24_1$ and a drain region $24_2$. Next, an oxide film 22 is formed to cover the entire surface of the substrate 10 including the side surface of the floating gate 18 and the like by the thermal oxidation, for example.

Figure 14B:
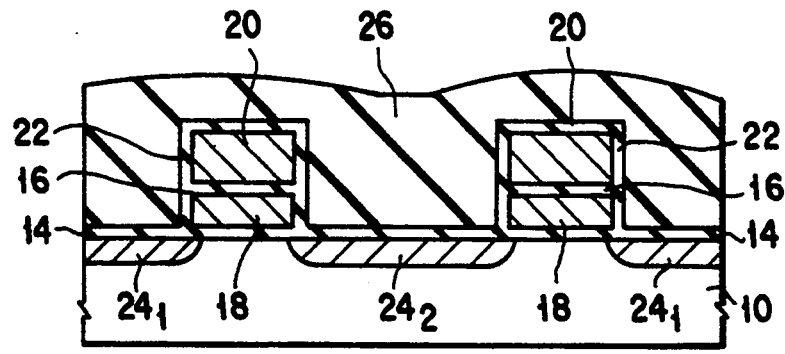
Figure 15B:
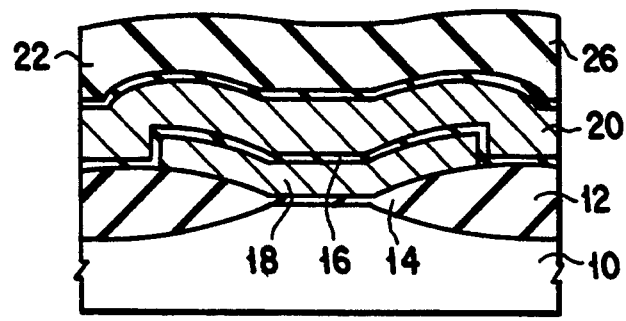

After this, as shown in FIGS. 14B and 15B, a BPSG film 26 is formed on the entire surface of the substrate 10 and then the surface of the BPSG film 26 is made flat by the thermal process.

Next, as shown in FIGS. 14C and 15C, a resist pattern is formed by the photolithographic technique and contact holes 28 reaching the desired source/drain regions 24 are formed in the BPSG film 26 by the RIE method with the resist pattern used as a mask. Then, an Al alloy film with a film thickness of 800 nm, for example, is formed on the entire surface of the BPSG film 26 by sputtering deposition. After this, a resist pattern is formed by the photolithographic technique and the Al alloy film is etched by the RIE method with the resist pattern used as a mask. In this etching process, a wiring layer (bit line) 30 is formed.

Figure 14D:
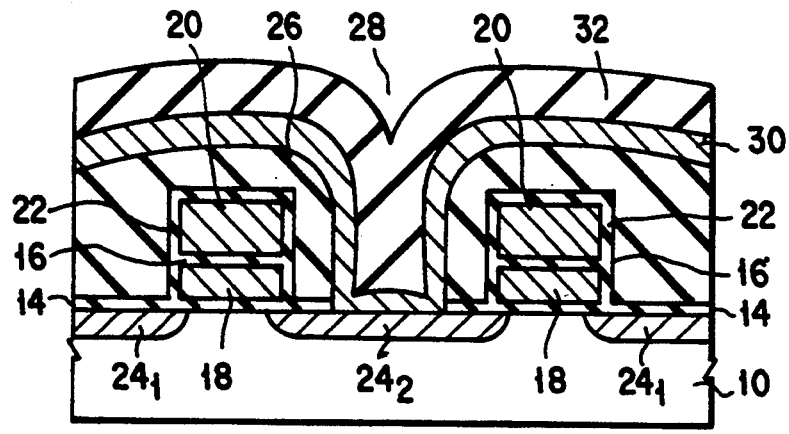
Figure 15D:
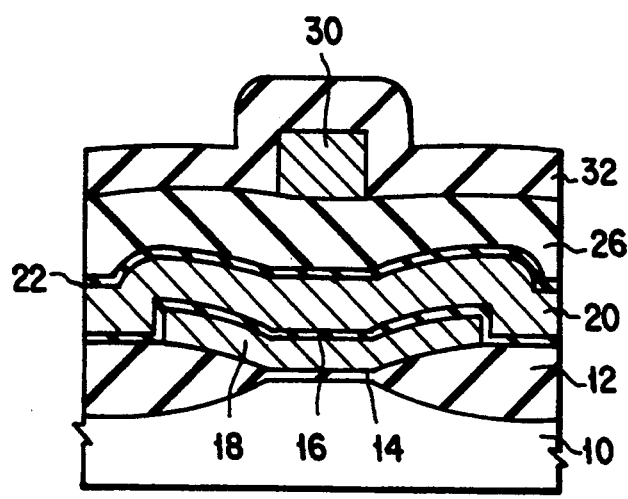

Next, as shown in FIGS. 14D and 15D, a silicon oxide film 32 whose refractive index is set in the range of 1.48 to 1.65 is formed on the BPSG film 30 to cover the wiring layer 30 by setting the temperature of the substrate to approximately 400° C. and reacting $SiH_4$ gas with $N_2O$ gas in a plasma atmosphere.

The EPROM is completed by the above process.

The EPROM of the above construction has a passivation film formed of the silicon oxide film 32 which is formed to cover the wiring layer 30. The silicon oxide film 32 is formed by reacting $SiH_4$ gas with $N_2O$ gas in a plasma atmosphere and the refractive index thereof is set to be not less than 1.48 and not more than 1.65. The refractive index thereof can be controlled by changing the flow rates of the $SiH_4$ gas or $N_2O$ gas flowing into the reaction chamber of a plasma CVD device to change the partial pressures of the respective gases, or by changing the substrate temperature, for example.

As a method of forming the silicon oxide film whose refractive index is set in the range of 1.48 to 1.65, a method of reacting tetraethyl orthosilicate, (Si-$(OC_2H_5)_4$ (hereinafter called "TEOS") gas, $O_2$ gas and a nitrogen-containing gas (e.g., $N_2$ gas or $N_2O$ gas) in plasma atmosphere, or a method of reacting TEOS gas and $N_2$ gas (or $N_2O$ gas) in plasma atmosphere can be employed, in place of the method wherein $SiH_4$ gas is reacted with $N_2O$ gas in the plasma atmosphere. When a silicon oxide film is formed by the later method, substantially the same effect can be attained as with the former method. Since the silicon oxide film is also formed in the plasma atmosphere by the later method, the film can be formed with the substrate temperature set at a temperature of 400° C., for example, which is lower than the melting point of the Al alloy constituting the wiring layer 30 as in the former method. Since the substrate temperature can be set to be lower than the melting point of the Al alloy constituting the wiring layer 30, the effect that occurrence of hillock or void caused by fluidization of the wiring layer 30 can be prevented.

Further, it may be considered that, when the silicon oxide films are formed by use of the above-described methods, the refractive indices may be changed by causing a certain type of impurity to be absorbed into the silicon oxide film. In the above two examples, the silicon films were grown by use of the following gases.

(1) $SiH_4$, $N_2O$;
(2) $Si(OC_2H_5)_4$, $O_2$, $N_2$ (or $N_2O$);
(3) $Si(OC_2H_5)_4$, $N_2$ (or $N_2O$);

Judging from the above mixed gases (1) to (3), it can be inferred that nitrogen is the impurity which causes the refractive index to be changed. It can also be considered that, if the impurity to be absorbed or introduced into the silicon oxide film is nitrogen, absorption of the impurity will not degrade the impurity resistance and moisture proofness thereof and is preferable.

Further, it was also found that the same effect as that of the above embodiment could be attained when the following manufacturing method was used as a third manufacturing method.

That is, a silicon oxide film is formed by reacting TEOS gas and $O_2$ gas and then the surface of the silicon oxide film is subjected to the plasma processing with the silicon oxide film exposed to the nitrogen plasma atmosphere so as to cause nitrogen to be absorbed or introduced into the silicon oxide film.

The cross section of an EPROM thus formed by use of the above manufacturing method is shown in FIG. 16.

In FIG. 16, a portion indicated by a reference numeral 33 is a region into which nitrogen is absorbed and in which the silicon oxide film 32 is partly modified into a nitride layer.

Like the above embodiment, the refractive index of the silicon oxide film can be changed by use of the above manufacturing method. Further, a good data retention characteristic can be attained by setting the refractive index in the range of 1.48 to 1.65.

The method of nitriding the surface of the silicon oxide film 32 can be applied to the silicon oxide film formed by the reaction of SiH$_4$ gas and N$_2$O gas, the silicon oxide film formed by the reaction of TEOS gas, O$_2$ gas and N$_2$ (or N$_2$O) gas, and the silicon oxide film formed by the reaction of TEOS gas and N$_2$ (or N$_2$O) gas.

Further, the same effect as that of the above example can be obtained by use of the following manufacturing method. A method of forming a silicon oxide film by reacting TEOS gas and ozone (O$_3$) gas by use of the atmospheric pressure CVD method. The refractive index of the silicon oxide film can be set into a range of 1.48 to 1.65 by introducing a gas containing nitrogen into the reactive gas atmosphere while the above method is being effected or by subjecting the surface of a silicon oxide film formed by the above method to the plasma nitrifying process.

Next, a second embodiment of this invention is explained.

Figure 17:
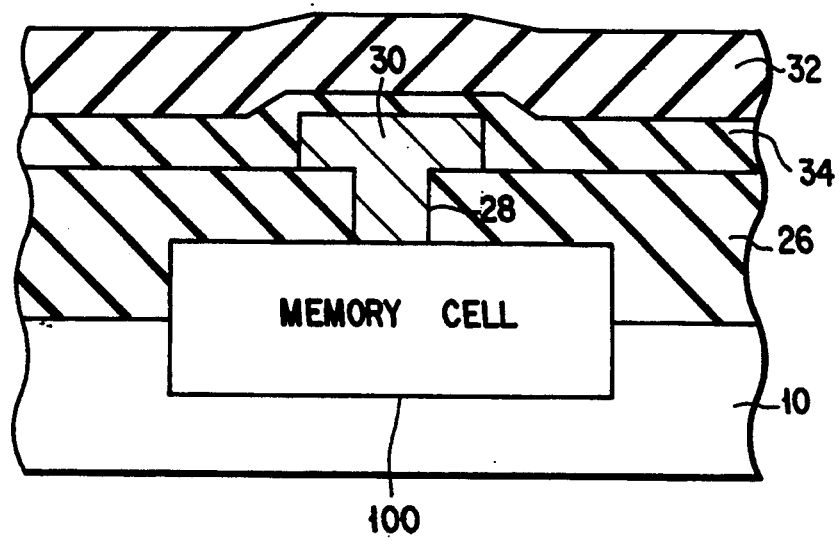
FIG. 17 is a schematic cross sectional view showing a semiconductor device having a passivation film according to a second embodiment of this invention.

FIG. 17 is a schematic cross sectional view showing a semiconductor device having a passivation film according to a second embodiment of this invention.

As shown in FIG. 17, a PSG film 34 whose surface is made flat is formed on a BPSG film 26 to cover a bit line 30. A silicon oxide film 32 whose refractive index is set in a range of 1.48 to 1.65 and which is used as a passivation film is formed on the PSG film 34.

A method for manufacturing the semiconductor device shown in FIG. 17 is explained below.

Figure 18B:
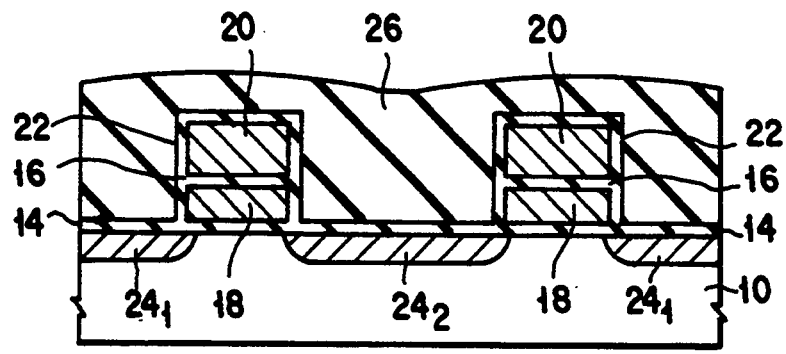
Figure 19B:
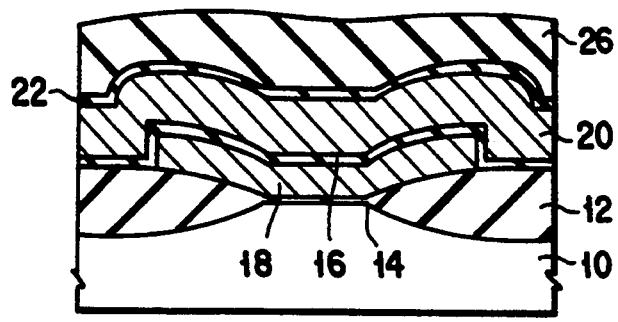
Figure 18C:
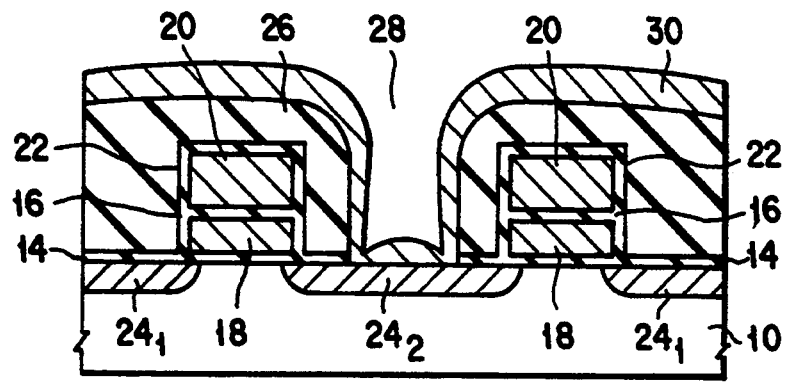
Figure 19C:
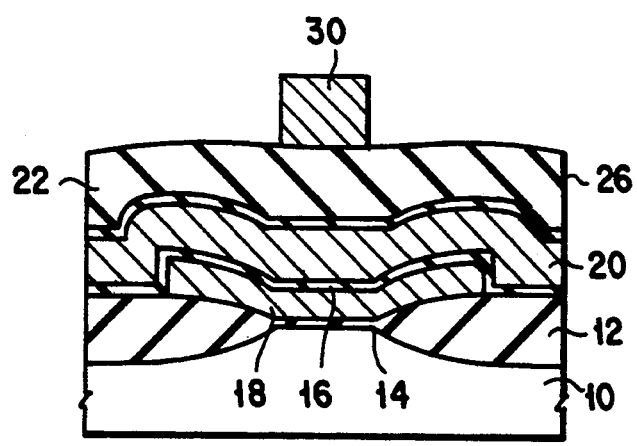

FIGS. 18 A to 18F are cross sectional views showing cross sections of a memory cell corresponding to the cross section taken along the A—A line of FIG. 13 in an order of the manufacturing steps. FIGS. 19A to 19F are cross sectional views showing cross sections of a memory cell corresponding to the cross section taken along the B—B line of FIG. 13 in an order of the manufacturing steps.

As shown in FIGS. 18A to 18C and FIGS. 19A to 19C, the manufacturing process up to a manufacturing step of forming a wiring layer 30 is effected in the same manner as the manufacturing process explained with reference to FIGS. 14A to 14C and FIGS. 15A to 15C.

After this, as shown in FIGS. 18D and 19D, an insulation film 34 formed of PSG, for example, is formed on the entire surface of the substrate 10. Next, as is shown in FIGS. 18E and 19E, the surface of the insulation film 34 is made flat. Any suitable planarization method may be used, such as the "etch-back method," whereby a resist is coated on the insulation film 34 to fill concave portions thereof, and then the insulation film 34 and resist are etched with a small selective etching ratio. Other suitable methods include using an inorganic or organic coating film, or using reflow or the like.

Figure 18F:
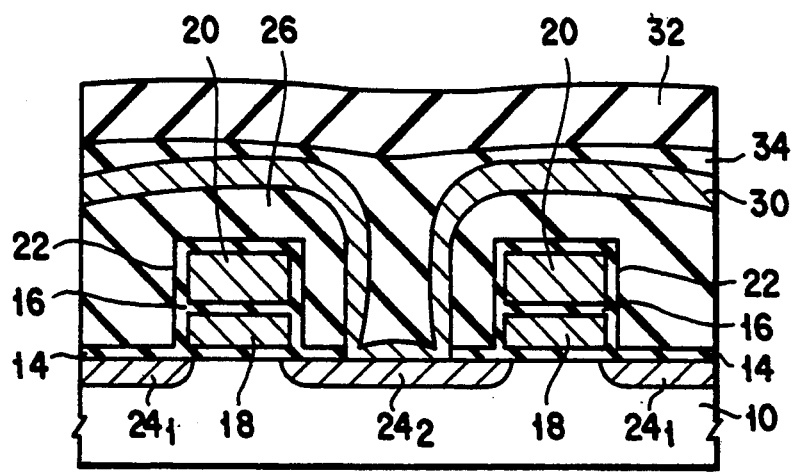
Figure 19F:
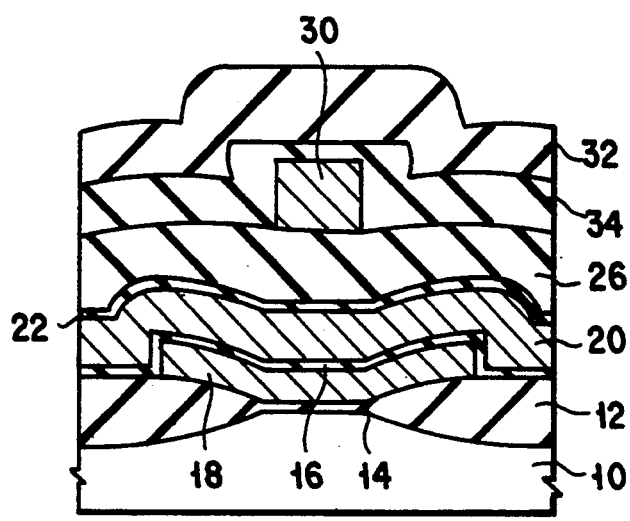

Next, as shown in FIGS. 18F and 19F, a silicon oxide film 32 is formed on the insulation film 34 whose surface is made flat. Like the silicon oxide film of the first embodiment, the silicon oxide film 32 is formed with the refractive index which is set to be not less than 1.48 and not more than 1.65. Further, the silicon oxide film 32 may be formed by use of the above-described manufacturing methods.

In the EPROM having the passivation film of the above construction, the same effect as that explained in the first embodiment can be attained. The silicon oxide film 32 has excellent resistance to impurities and is moisture proof. In addition, since the silicon oxide film 32 is formed on the planarized insulation film 34, the silicon oxide film 32 can be uniformly deposited. The uniform film thickness of the silicon oxide film 32 enhances the shielding effect of preventing mobile ions, water, moisture or the like from entering the semiconductor device. In a case where multi-layered wiring is used, for example, short-circuit or breakage of the wiring layer formed on the silicon oxide film 32 can be prevented and a structure suitable for multi-layered wiring can be obtained since the surface of the silicon oxide film 32 is made flat. Like the first embodiment, in the second embodiment, it is preferable to set the refractive index of the silicon oxide film 32 to be not less than 1.48 and not more than 1.60 when the minimum wiring width of the wiring layer 30 is set equal to or less than 1.2 μm.

As shown in FIG. 20, it is possible to control the refractive index by subjecting the surface of the silicon oxide film 32 to the plasma process using nitrogen to form the nitride region 33 in the surface area of the silicon oxide film 32.

This invention has been completely described with respect to the above embodiments, but this invention is not limited to the above embodiments and can be modified without departing from the technical scope thereof. For example, in the above embodiments, a P-type single crystal silicon substrate is used. Alternatively, but an N-type single crystal silicon substrate can be used, and the main surface area of the semiconductor substrate can be formed of P-type by ion-implanting P-type impurity such as boron into the main surface area thereof or P-type diffused regions Can be formed by ion-implanting P-type impurity such as boron into the source and drain regions. Further, in the above embodiments, the laminated film of polysilicon and silicide is used as the control gate. Alternatively, but the control gate may be formed of a single polysilicon film or a single silicide film. Further, the silicon oxide film is used as the insulation film between the floating gate and the control gate. Alternatively, but a laminated insulation film of a silicon oxide film and a nitride film may be used as the insulation film. In addition, the silicon oxide film formed on the wiring layer is not necessarily disposed on the top position of the EPROM and, for example, a film such as a PSG film can be formed on the silicon oxide film.

In the above embodiments, a nonvolatile semiconductor memory device is explained by taking an OTPROM, EPROM and EEPROM as examples, but this invention can be effectively applied to a passivation film used for a one-chip microcomputer having the above devices formed on the same substrate.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

what is claimed is:

1. A semiconductor device comprising:

a semiconductor substrate having a main surface;

a memory cell formed in said main surface of said substrate, said memory cell including a charge storage layer;

a first insulation film formed on said substrate to cover said memory cell;

an opening in said first insulation film extending to said memory cell;

an internal wiring layer electrically connected to said memory cell via said opening; and a passivation film formed of material containing at least silicon and oxygen and formed on said first insulation film to cover said internal wiring layer, said passivation film having a refractive index of not less than 1.48 and not more than 1.60 at a wavelength of 6328 angstroms and the minimum wiring width of said internal wiring layer being not more than 1.2 µm.

2. A semiconductor device according to claim 1, further comprising a second insulation film provided between said first insulation film and said passivation film; and wherein said passivation film further contains nitrogen to have the refractive index set within a range of 1.48 to 1.60.

3. A semiconductor device according to claim 1, further comprising a region containing nitrogen formed in the surface area of said passivation film.

4. A semiconductor device according to claim 3, wherein said region is a nitrified region.

5. A semiconductor device according to claim 1, wherein said memory cell is a nonvolatile memory cell having a charge storing section.

6. A semiconductor device according to claim 5, wherein said nonvolatile memory cell is a programmable ROM cell.

7. A semiconductor device according to claim 5, wherein said nonvolatile memory cell is an erasable and programmable ROM cell.

8. A semiconductor device according to claim 5, wherein said nonvolatile memory cell is an electrically erasable and programmable ROM cell.

9. A semiconductor device comprising:

a semiconductor substrate having a main surface;

a memory cell formed in said main surface of said substrate;

a first insulation film formed on said substrate to cover said memory cell;

an opening in said first insulation film extending to said memory cell;

an internal wiring layer electrically connected to said memory cell via said opening;

a second insulation film having a planar upper surface and formed on said first insulation film to cover said internal wiring layer; and a passivation film comprising at least silicon and oxygen and formed on said second insulation film to cover said internal wiring layer, said passivation film having a refractive index of not less than 1.48 and not more than 1.60 at a wavelength of 6328 angstroms and the minimum wiring width of said internal wiring layer being not more than 1.2 µm.

10. A semiconductor device according to claim 9, wherein said passivation film further contains nitrogen.

11. A semiconductor device according to claim 9, further comprising a region containing nitrogen formed in the surface area of said passivation film.

12. A semiconductor device according to claim 11, wherein said region is a nitrified region.

13. A semiconductor device according to claim 9, wherein said memory cell is a nonvolatile memory cell having a charge storing section.

14. A semiconductor device according to claim 13, wherein said nonvolatile memory cell is a programmable ROM cell.

15. A semiconductor device according to claim 13, wherein said nonvolatile memory cell is an erasable and programmable ROM cell.

16. A semiconductor device according to claim 13, wherein said nonvolatile memory cell is an electrically erasable and programmable ROM cell.

* * * * *